United States Patent [19]
McKim, Jr. et al.

[11] Patent Number: 5,671,147
[45] Date of Patent: Sep. 23, 1997

[54] AC MAINS TEST SYSTEM FOR MEASURING CURRENT HARMONICS AND VOLTAGE VARIATIONS

[75] Inventors: James B. McKim, Jr., Blairstown; John F. Kenny, Jr., Califon, both of N.J.

[73] Assignee: Hewlett-Packard Company, Palo Alto, Calif.

[21] Appl. No.: 514,197

[22] Filed: Aug. 11, 1995

[51] Int. Cl.⁶ .................................................. G06F 17/40
[52] U.S. Cl. ...................... 364/481; 324/76.24; 364/480; 364/579
[58] Field of Search ................ 324/76.19, 76.24, 324/615; 364/480, 481, 550, 579, 580, 718

[56] References Cited

U.S. PATENT DOCUMENTS

| | | | |
|---|---|---|---|
| 3,526,832 | 9/1970 | Post | 324/615 X |
| 4,044,244 | 8/1977 | Foreman et al. | 371/22.1 |
| 4,055,801 | 10/1977 | Pike et al. | 364/550 X |
| 4,161,029 | 7/1979 | Frye et al. | 364/579 |
| 4,613,814 | 9/1986 | Penney | 324/615 X |
| 4,740,744 | 4/1988 | Lubarsky et al. | 324/76.24 X |
| 4,791,384 | 12/1988 | Mackey et al. | 364/718 |
| 4,807,161 | 2/1989 | Comfort et al. | 364/550 |
| 5,432,705 | 7/1995 | Severt et al. | 364/481 |

Primary Examiner—Edward R. Cosimano

[57] ABSTRACT

A digital system measures cyclic disturbance signals on an electrical line that are induced by a connected unit under test (UUT). The system includes a digital to analog (D/A) converter which receives and converts a first train of digital signals to a cyclic analog test signal and applies that signal to the electrical line. An analog to digital (A/D) converter receives and converts analog cyclic disturbance signals from the electrical line to a second train of digital signals. A synch generator applies a train of synch pulses, concurrently, to synchronizing inputs of the D/A converter and the A/D converter so that their respective conversion operations are based upon a common time-base signal. A processor is coupled to the D/A converter and A/D converter and outputs the first train of digital signals to the D/A converter and receives the second train of digital signals from the A/D converter. The processor subjects a portion of the second train of digital signals to signal analysis, with the portion of the second train being representative of an integer number of cycles of the cyclic disturbance signal sensed from the electrical line. The clock frequency which causes generation of the synch pulses is selected so that the synch pulses have a precise, predetermined relationship to a predetermined number of cycles of the cyclic signal (in the case of a power spectrum analysis) or a predetermined number of half cycles (in the case of an amplitude analysis).

20 Claims, 5 Drawing Sheets

| SOURce:FREQ | SENSe:WINDow | SAMPLE RATE | DECIMATION RATE | ACQUISITION WINDOW | CYCLES |
|---|---|---|---|---|---|
| 50Hz | RECTangular | 12.800KHz | 3X | 320ms | 16@50HZ |
| 50Hz | HANNing | 8.533KHz | 4.5X | 480ms | 24@50Hz |
| 60Hz | RECTangular | 15.360KHz | 2.5X | 266.7ms | 16@60Hz |
| 60Hz | HANNing | 7.680KHz | 5X | 533.3ms | 32@60Hz |
FIG. 1a
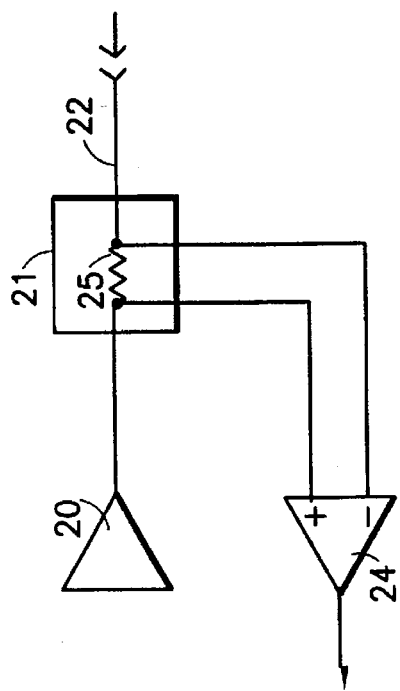
FIG. 1b
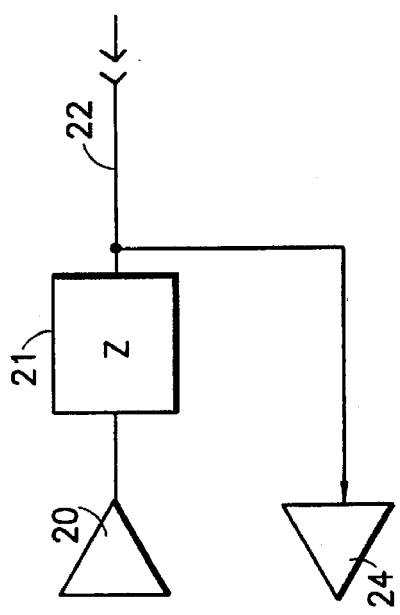
FIG. 1c

AC MAINS TEST SYSTEM FOR MEASURING CURRENT HARMONICS AND VOLTAGE VARIATIONS

FIELD OF THE INVENTION

This invention relates to a test system for measuring current harmonics and voltage fluctuations which result from connection of a power consuming product to an AC main and, more particularly, to an AC main test system which provides measures of current harmonics and voltage fluctuations with a high degree of accuracy.

BACKGROUND OF THE INVENTION

Unless a product which consumes AC power is carefully designed, its operation can induce current harmonics and/or voltage variations on the AC main which can create serious problems. For instance, in a balanced three-phase supply system, the neutral conductor is designed based on the expectation that there is little current flow therein. If, however, harmonic currents result from the operation of a device connected to the three-phase system, an imbalance can occur in the three phases which results in increased current flow in the neutral conductor. Such a current flow can cause an overheating of the neutral conductor and create a severe fire risk.

Many devices which plug into the AC main now include switch-mode power supplies which periodically draw high-peak currents from the AC main. Typically, such a power supply includes a rectifier which charges a bank of capacitors. The resulting capacitor voltage is then chopped to provide an output power supply voltage. There is no current conduction in the rectifier until the charge voltage on the capacitor is exceeded by the AC supply voltage. At such time, a current transient occurs which is rich in harmonic content. Such operation induces harmonic signals on the AC main line (i.e. signals containing a fundamental component and one or more harmonic components, typically the 3rd, 5th, 7th, etc. . . . ).

If a device powered by a switch-mode power supply exhibits a constant load, current drawn from the power supply is relatively constant over time. In such case, harmonic currents induced by the power supply on the AC main are said to be "quasi stationary". By contrast, if the load connected to the power supply varies with time, the resulting harmonic currents induced on the AC main also vary and are said to be "fluctuating" harmonic signals. Such a time varying AC main current, when drawn through a branch circuit's impedance, causes a voltage drop that fluctuates in accord with fluctuations of the induced harmonic signals. Those fluctuations in voltage, if too large in magnitude, are visually perceivable as flicker in incandescent lamps powered from the AC main.

In Europe, regulatory standards have been established which set upper thresholds for acceptable, fluctuating and quasi-stationery harmonic signals that result from operation of a product to be connected to the AC main. At present, standard IEC555-2 sets the allowable limits for harmonic currents induced in an AC main by an attached load. The IEC555-3 standard sets allowable thresholds for voltage variations induced in an AC main by a load, in terms of human perceptibility of resultant intensity variations or flicker of an attached incandescent lamp. To assure that a product meets one or both standards, requires use of an instrument which makes extremely precise measurements of both the harmonic content of the induced current signals on the AC main (in the case of a harmonic test) and of the level of induced RMS voltage variations (in the case of a "flicker" test). Further, both of the standards require that products be tested over an extended period of time (e.g., up to 7 days in the case of a harmonic test).

The prior art includes test systems for measuring both product-induced harmonic current and voltage fluctuations on an AC main. Those test systems, in general, include a power supply which generates a current at the supply frequency (e.g. 50 Hz, 60 Hz) and provide an outlet into which the power cord of the unit under test can (UUT) be plugged. Current variations in the line connecting the power supply to the UUT test are converted to digital values by an analog/digital (A/D) converter and are subjected to signal analysis in a host processor. In the case of harmonic signal analysis, the host processor performs a Fourier analysis to derive a power spectrum of the harmonic components present on the AC main.

In the case of a "flicker" test, a similar system configuration is employed except that a reference impedance is connected between the source of the AC signal and the UUT. The sensed analog signal is derived at the load side of the reference impedance, and the host processor employs a procedure which enables the RMS content of the voltage waveform to be measured on a half-cycle by half-cycle basis over an extended period of time. These measurements are then further processed to yield an output calibrated in terms of human perceptability.

Certain prior art instruments utilize as the power supply, the AC main from the utility, with some signal conditioning such as through the use of passive impedance networks, variacs, etc. Other more recent systems employ an AC source synthesizer which provides an AC output in accordance with digital input signals.

Both categories of instruments described above suffer from a need to establish synchronization of the measurement process to the AC main frequency. Typically, this is accomplished by using a phase-locked loop that detects and locks the measurement process to the AC line frequency. This approach may work adequately in the case where an AC power synthesizer is employed, but suffers serious drawbacks in the case where the power utility AC line is employed—due to short-term instabilities of the AC line frequency. In both cases, the phase-locked loop must be quite narrow-band in order to establish adequate synchronization. This, in turns, implies long lock times, following frequency transients and corresponding problems with loss of lock and subsequent invalidation of tests that require uninterrupted long-term measurements. Similar problems also arise in flicker tests when amplitude transients can be interpreted by the phase-lock circuitry as frequency transients. Lastly, initial test start-ups present problems as well, since there is a requirement that the harmonic tests begin no more than 10 seconds after application of AC main power to the UUT.

IEC standards for tests of harmonic current levels indicate a preference that a Fourier transform procedure be employed in the signal analysis. The standards further imply a synchronization between the generation and measurement processes of roughly two parts in $10^4$. The effect of insufficient synchronization is particularly apparent as the harmonic number increases. This is due to the fact that a Fourier transform may be viewed in the frequency domain as a set of bandpass filters, with constant bandwidths (in units of Hz) that are centered on integer multiples of the fundamental frequency. When synchronization is perfect, all harmonics are precisely centered in the bandpass of these filters and there is no error introduced into the power spectrum. With imperfect synchronization, however, an error of, for example, 0.1 Hz at the fundamental frequency becomes an error of n×0.1 Hz at the nth harmonic. Since the nth harmonic is n times further off the center frequency of the filter, the response to the signal moves down the "skirt" of the filter characteristic, causing significant accuracy degradation.

Further, the aforesaid harmonic measurement standards require that a certain number of cycles of the fundamental frequency be analyzed in each measurement, thereby establishing a time acquisition window over which the harmonic currents are to be sensed. They further specify the type of signal conditioning to which the signal is to be subjected and the time window over which the signal is to be analyzed. In a first case, a "rectangular" window is specified wherein a constant level of signal conditioning is applied across the entire spectrum. A further test requires the use of a "Hanning" window which is a raised $cosine^2$ function in shape. These window shapes influence the filter's characteristic if synchronization is imperfect.

SUMMARY OF THE INVENTION

A digital system measures cyclic disturbance signals on an electrical line that are induced by a connected unit under test (UUT). The system includes a digital to analog (D/A) converter which receives and converts a first train of digital signals to a cyclic analog test signal and applies that signal to the electrical line. An analog to digital (A/D) converter receives and converts analog cyclic disturbance signals from the electrical line to a second train of digital signals. A synch generator applies a train of synch pulses, concurrently, to synchronizing inputs of the D/A converter and the A/D converter so that their respective conversion operations are based upon a common time-base signal. A processor is coupled to the D/A converter and A/D converter and outputs the first train of digital signals to the D/A converter and receives the second train of digital signals from the A/D converter. The processor subjects a portion of the second train of digital signals to signal analysis, with the portion of the second train being representative of an integer number of cycles of the cyclic disturbance signal sensed from the electrical line. The clock frequency which causes generation of the synch pulses is selected so that the synch pulses have a precise, predetermined relationship to a predetermined number of cycles of the cyclic signal (in the case of a power spectrum analysis) or a predetermined number of half cycles (in the case of an amplitude analysis).

BRIEF DESCRIPTION OF THE DRAWINGS

FIG. 1a is a table which sets out certain parameters for the operation of the system of FIG. 1.

FIG. 1b illustrates a circuit connection used by the system of FIG. 1 when performing a harmonic analysis procedure.

FIG. 1c illustrates a circuit connection used by the system of FIG. 1 when performing a flicker analysis procedure.

DETAILED DESCRIPTION OF A PREFERRED EMBODIMENT

Figure 1:
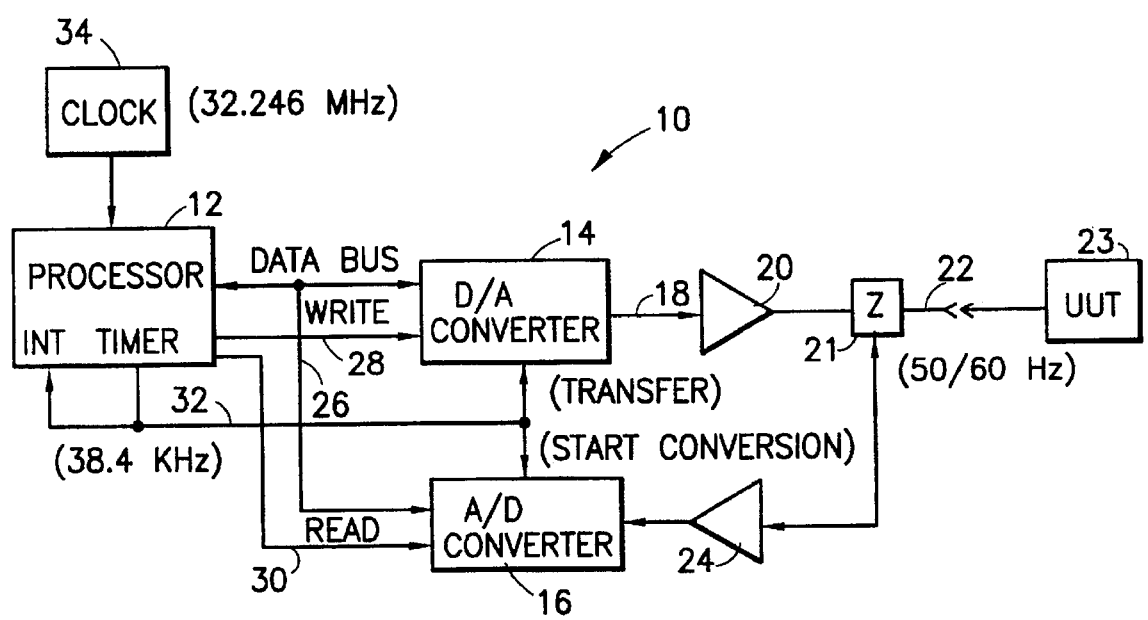
FIG. 1 is a high-level block diagram of a system which incorporates the invention.

Referring to FIG. 1, AC mains test systems 10 comprises three main components, a processor 12, a D/A converter module 14 and an A/D converter module 16. Processor 12 provides a first train of digital signals to D/A converter module 14, which, in turn, converts the digital signal train into an AC signal output, at the mains frequency of either 50 Hz or 60 Hz, and applies the output to line 18. The resulting AC signal is amplified by a power amplifier 20 and applied as an output test signal, via an impedance 21, to output line 22. A UUT 23 plugs into output line 22 and employs the analog AC signal appearing thereon as its primary power source.

Signal variations appearing at impedance 21 are amplified in amplifier 24 and fed to A/D converter module 16 which, in turn, provides a second train of corresponding digital signals to processor 12. Within processor 12 is a signal analysis protocol that enables either a power spectrum analysis of a received integer number of full cycles of the sensed analog signal, via a fast Fourier transform procedure, or an amplitude analysis of a received integer number of half-cycles of the sensed analog signal.

Processor 12 provides the first train of digital signals to D/A converter module 14 via bus 26 and receives the second train of digital signals from A/D converter module 16 via the same bus structure. Read/write enable signals are applied to D/A converter module 14 and A/D converter module 16 via lines 28 and 30, respectively.

To accomplish precise synchronization of D/A converter module 14 and A/D converter module 16, a synch pulse signal train is concurrently applied thereto via line 32 from processor 12. The synch pulse train is derived in processor 12 by dividing a clock signal received from clock generator 34 by an integer factor to achieve a synch pulse rate that has a prescribed relationship to the A/C mains frequency. In the preferred embodiment, clock generator 34 outputs a 32.256 MHz signal. Synch pulses are generated at a 38.4 KHz rate by dividing the 32.256 MHz clock frequency by a factor of 840.

Each synch pulse signal is fed to a "transfer" input of D/A converter module 14 and a "start conversion" input of A/D converter module 16. In response to a received synch pulse input, D/A converter module 14 transfers a digital data value, received from processor 12, from an asynchronous input register to a further register that synchronously drives a D/A converter. The D/A converter outputs an analog value in accordance with the input digital value. Simultaneously, a synch pulse applied to the "start conversion" input causes a sample/hold amplifier included within A/D converter module 16 to switch from a "sample" mode wherein it tracks an analog level on line 22, to a "hold" mode wherein it holds (i.e., "freezes") the analog sensed level. Logic within A/D converter module 16 thereafter synchronously converts the "frozen" analog input level to a digital value and feeds that value to processor 12 for analysis.

Simultaneous with application of a synch pulse to the respective converter modules, a high priority interrupt terminal INT in processor 12 receives the same synch pulse. In response, processor 12 schedules both a feed of data to D/A converter module 14 and a reading of data from A/D converter module 16 before occurrence of a next synch pulse. Thus, an uninterrupted sequence of digital signals are fed to D/A converter module 14 and read operations are enabled of digital voltage values from A/D converter module 16.

After sufficient digital values are read from A/D converter module 16 and stored, processor 12 selects a sample of the stored values for signal analysis. Proper selection of the synch pulse frequency enables a predetermined number of stored digital voltage samples to be sampled and analyzed (within a determined window of time). In the case of a power spectrum analysis, the selection assures that analysis is carried out upon an integer number of cycles of the synthesized AC mains frequency. In the case of an amplitude analysis, the selection assures that analysis is carried out upon an integer number of half cycles of the synthesized AC mains frequency.

As one of the above-noted standards requires that 16 cycles of the mains frequency be subjected to Fourier analysis, the synch pulse frequency is selected so that a pre-determined number of stored digital voltage values comprise the 16 cycles. In the preferred embodiment, 4k (4096) samples are selected.

The following relationship determines how the sample frequency is determined:

$$Fs=(4096 \times \text{fundamental frequency})/n$$

where:
Fs is the sample frequency;
fundamental frequency is either 50 Hz or 60 Hz;
n is the integer number of cycles (or half cycles) of the fundamental to be subjected to analysis.

The preferred embodiment of the invention employs a 38.4 KHz synch pulse frequency. Within processor 12 (and in the case of an FFT analysis), a set of digitally implemented multi-rate finite impulse response (FIR) filters further sample the incoming digital voltage sample data at a required sample rate Fs which enables a 4k data sample to accurately represent a precise number of cycles (e.g., 16 cycles) at the AC mains fundamental frequency. The table shown in FIG. 1a illustrates that, at 4k samples, that a sample rate of 12.8 KHz is to be employed to acquire 16 integer cycles of data. The 12.8 KHz is achieved by decimating the 38.4 KHz rate by a factor of 3.

The sampling criteria for AC mains frequencies at 50 Hz and 60 Hz, using both Hanning and rectangular sense windows, can be similarly derived from table in FIG. 1a. Note that for the required sample rates indicated in FIG. 1a, that 38.4 KHz is either an integer multiple of the required sample rate or is a 0.5 multiple thereof. This enables a straightforward decimation action in the FIR filters to reach the required value of Fs.

In the case of amplitude measurement (IEC555-3), the preferred embodiment of the invention employs two of the aforementioned multi-rate FIR digital filters to produce new sample rates of 12.8 Hz (50 Hz mains frequency) and 7.68 KHz (60 Hz mains frequency). These sequences of digital voltage samples are further sampled using multi-rate filtering means similar to those described above to produce sequences of digital voltage samples at rates of 400 HZ (50 Hz) and 480 Hz (60 Hz) respectively. At these sampling frequencies there are exactly 8 samples per full cycle of the synchronized mains frequency waveform and exactly 4 samples per half cycle. These new sequences are in turn processed digitally to detect amplitude variations in units of RMS voltage and human flicker perceptibility on a half cycle by half cycle basis producing finally output sequences at rates of 100 Hz (50 Hz) and 120 Hz (60 Hz), these rates and integration periods corresponding exactly to the periods of successive half cycles of the synchronized mains frequency waveform.

FIG. 1b illustrates the circuit configuration employed when an harmonic analysis procedure is implemented in the system of FIG. 1. Impedance 21 comprises a resistance 25 through which current flow to UUT 23 is monitored. Amplifier 24 is a differential amplifier, receives inputs from both ends of resistor 25 and outputs a voltage proportional to the potential difference across resistor 25. That voltage is proportional to the current flow between amplifier 20 and UUT 23. In the case of a flicker measurement the circuit of FIG. 1c is employed, Impedance 21 is a combined resistance-inductance circuit and the input to amplifier 24 is taken from the load side (UUT) thereof.

Figure 2:
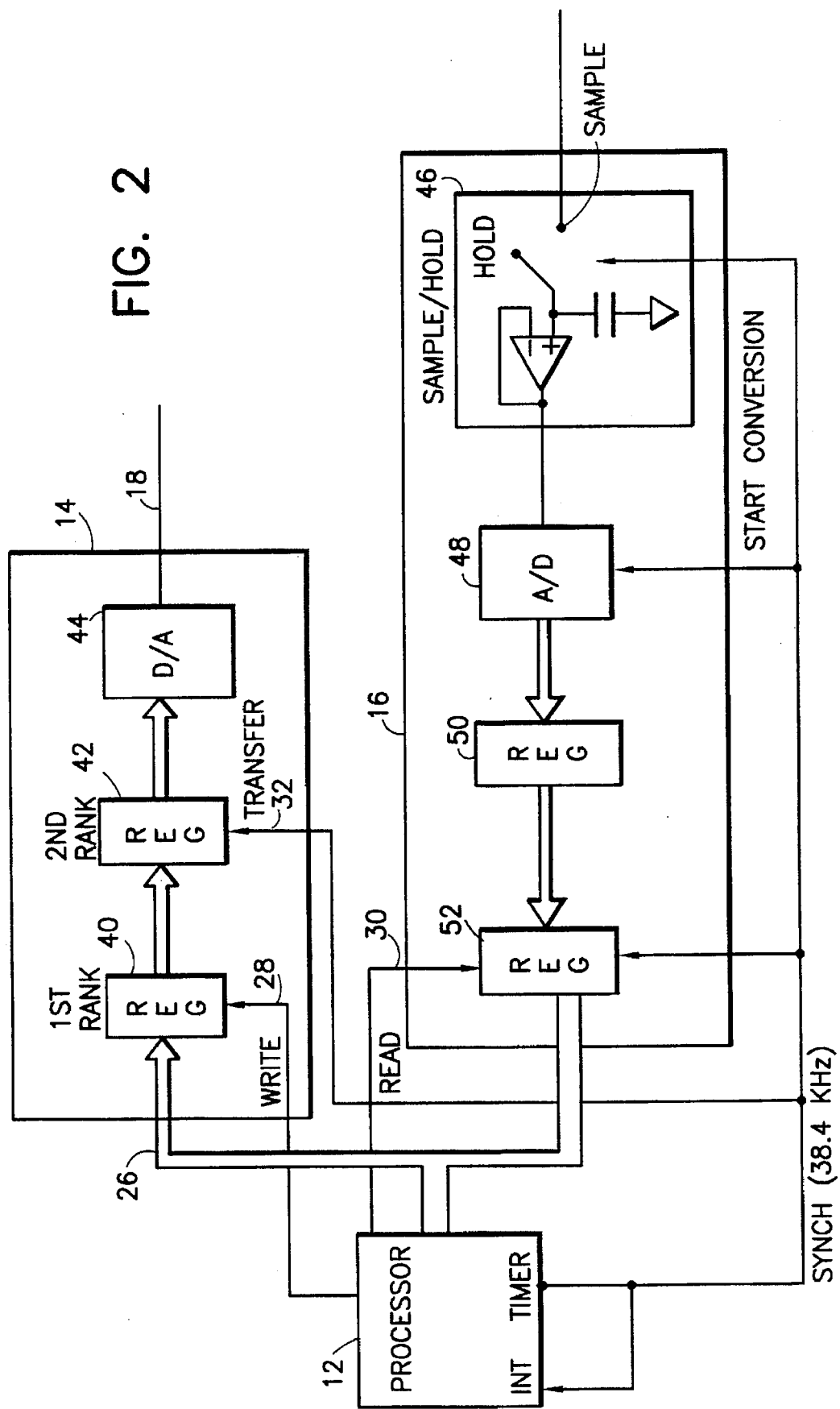
FIG. 2 is a block diagram which illustrates additional details of D/A and A/D converters employed by the invention.

Turning now to FIG. 2, further details of the system of FIG. 1 will be described. D/A converter module 14 includes a first rank register 40, a second rank register 42 and a digital to analog converter circuit 44. A/D converter module 16 includes a sample/hold circuit 46, an A/D converter circuit 48, a first register 50 and a second register 52. Synch pulses are applied by processor 12 concurrently and via line 32 to second rank register 42, sample/hold circuit 46, A/D converter circuit 48 and second register 52. The concurrently applied synch pulses enable synchronous operation of the aforesaid circuit components.

Figure 3:
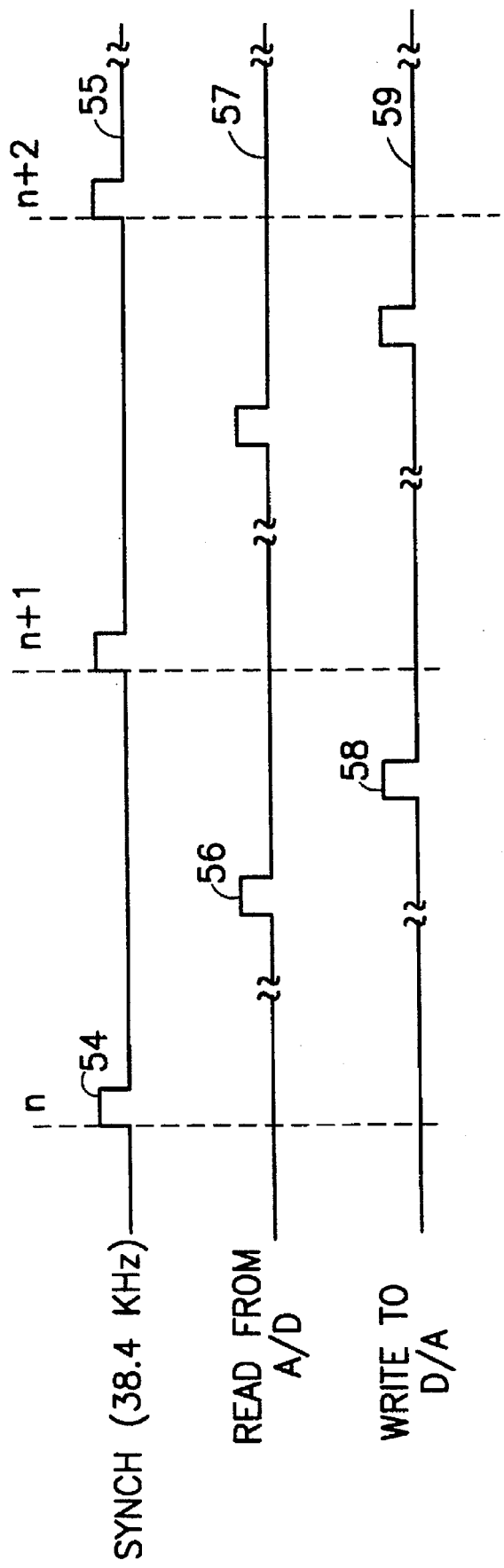
FIG. 3 is a timing diagram useful in understanding the operation of the invention.

In FIG. 3, synch pulses 54 are shown by trace 55, a read enable signal 56 by trace 57 and a write enable signal 58 by trace 59. It should be understood that the exact timing of the read enable signal 56 and write enable signal 58 is not critical except that both signals must occur after a first synch pulse and before occurrence of a next synch pulse. Signals 56 and 58 enable the asynchronous outputting of data from A/D converter module 16 to processor 12 and the inputting of data from processor 12 into D/A converter module 14.

In operation, after occurrence of a synch pulse 54, processor 12 enables a read operation from second register 52 in A/D converter module 16 by applying a read enable signal 56 to line 30. Similarly, processor 12 enables a write action into first rank register 40 by application of a write enable signal 58 to line 28. In such manner, between succeeding synch pulses 54, a new digital value is written into first rank register 40 and a previously inserted digital voltage value in second register 52 is read into memory within processor 12. Upon the occurrence of a next synch pulse, the value read into first rank register 40 is clocked into second rank register 42, which immediately outputs the digital value to D/A converter circuit 44. In response, D/A converter circuit 44 immediately applies a corresponding analog level output to line 18.

Similarly, until the occurrence of a synch pulse, sample/hold circuit 46 in A/D converter module 16 is in the sample state. Upon occurrence of a synch pulse, sample/hold circuit 46 switches from the sample state to the hold state and applies the held potential to A/D converter circuit 48. In response to the same synch pulse, A/D converter circuit 48 converts the held analog value to a digital value and immediately inserts that value into first register 50. A next synch pulse causes the value from first register 50 to be entered into second register 52 where it is ready for output to processor 12, upon occurrence of a next read pulse 56. While there is an offset of 1 synch pulse between operation of D/A converter module 14 and A/D converter module 16, the operations thereof still remain in lockstep due to the common application of synch pulses 54.

Figure 4:
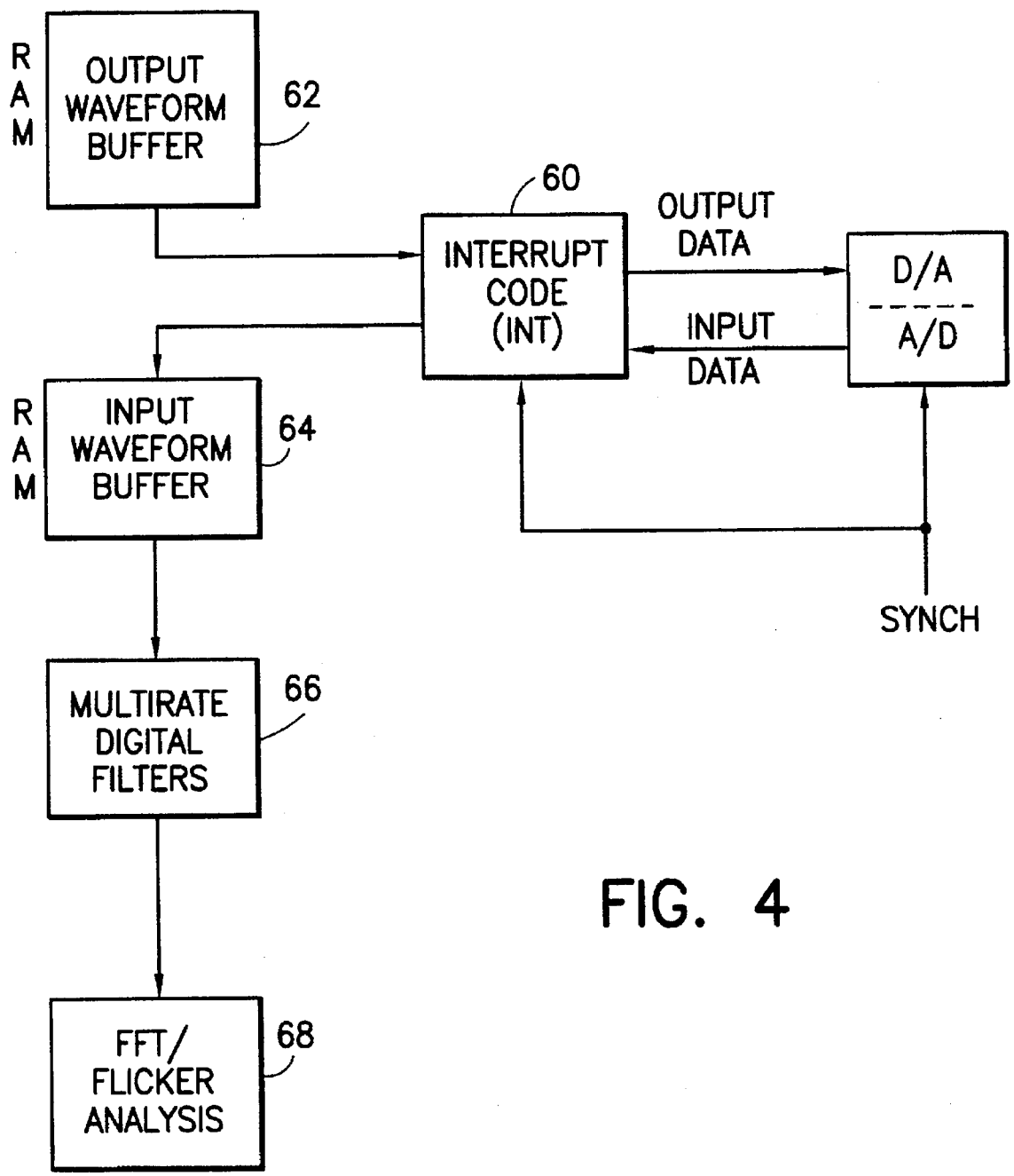
FIG. 4 is a simplified diagram of an interrupt operation within the processor which forms a portion of the invention.

In FIG. 4, an interrupt action within processor 12 is schematically illustrated. In response to each synch pulse applied to an interrupt input INT, an interrupt code sequence 60 is started. Interrupt code sequence causes an output digital value to be fed from output waveform buffer 62 to D/A converter module 14. Interrupt code sequence 60 further causes an input from A/D converter module 16 to be fed to input data waveform buffer 64. Thereafter, in accordance with the AC mains frequency being analyzed, the input digital data is subjected to a decimation action in digital filters 66. This action derives a desired number of data samples which exactly incorporate a pre-set integer number of cycles of the AC main frequency to be analyzed. The decimation action, in the specific example given above, acquires 4K digital sample values of 16 cycles for signal analysis. Thereafter, the 4K digital values are fed to An FFT analysis procedure. A similar procedure is used to accumulate data records corresponding to precisely a an integer number of half cycles of the AC mains frequency. These samples are then subjected to an amplitude (i.e., flicker) analysis procedure (68) which analyzes the data for levels of amplitude modulation. Since the procedure assures application of an integer number of cycles (or half cycles) of sensed test data, highly accurate analysis is assured.

It should be understood that the foregoing description is only illustrative of the invention. Various alternatives and modifications can be devised by those skilled in the art without departing from the invention. For instance, while the invention has been described in the context of a single phase system, it is equally applicable to a multi-phase system. In such a case, the D/A, A/D structure, etc. would be duplicated for each phase and processor 12 would analyze data retrieved from each phase as described above. Accordingly, the present invention is intended to embrace all such alternatives, modifications and variances which fall within the scope of the appended claims.

We claim:

1. A digital system for measuring cyclic disturbance signals induced on an electrical line by a connected unit under test (UUT), said digital system comprising:
    digital to analog (D/A) conversion means for receiving and converting a first train of digital signals to a cyclic analog test signal and for applying said cyclic analog test signal to said electrical line, said D/A conversion means having a synchronizing input which, in response to a synch pulse input, operates to convert a digital input to an analog signal level;
    analog to digital (A/D) conversion means for receiving and converting an analog cyclic disturbance signal on said electrical line to a second train of digital signals, said A/D conversion means having a synchronizing input which, in response to a synch pulse input, operates to convert an analog cyclic disturbance signal level to a digital signal;
    synch generator means for generating a train of synch pulses and concurrently applying said synch pulses to said synchronizing input of each of said D/A conversion means and said A/D conversion means, such that said second train of digital signals is produced in frequency synchronism with said cyclic analog test signal that is applied to said electrical line; and
    processor means coupled to said D/A conversion means and said A/D conversion means, for outputting said first train of digital signals to said D/A conversion means and for receiving said second train of digital signals from said A/D conversion means, and for subjecting a portion of said second train of digital signals to signal analysis, said portion representative of at least an integer number of half cycles of said analog cyclic disturbance signal.

2. The digital system as recited in claim 1, wherein said portion is representative of an integer number of full cycles of said analog cyclic disturbance signal.

3. The digital system as recited in claim 1, wherein said processor means subjects said portion of said second train of digital signals representative of at least an integer number of half cycles of said analog cyclic disturbance signal to an amplitude modulation analysis procedure.

4. The digital system as recited in claim 1, wherein said D/A conversion means impresses a synthesized AC signal having either a 50 or 60 Hertz frequency on said electrical line, said frequency controlled by said first train of digital signals.

5. The digital system as recited in claim 1, wherein said analog cyclic disturbance signal is derived by sensing voltage at a point between an impedance positioned in said electrical line and a connected UUT.

6. The digital system as recited in claim 1, wherein said D/A conversion means includes a first rank register for receiving a digital signal of said first train between synch pulse inputs and a second rank register for receiving said digital signal from said first rank register upon occurrence of a synch pulse input, said D/A conversion means immediately converting said digital signal to an analog level.

7. The digital system as recited in claim 6, wherein said A/D conversion means includes a converter circuit which, in response to a synch pulse input, converts a sample voltage of said cyclic analog disturbance signal to a digital signal of said second train and stores said digital signal in register means, said register means thereafter operated by said processor means, prior to occurrence of a next synch pulse, to output said digital signal to said processor.

8. The digital system as recited in claim 1, wherein said processor means includes filter means for decimating said second signal train to derive a pre-set number of digital signal values which exactly encompass an integer number of cycles (or half cycles) of said analog cyclic response signal.

9. The digital system as recited in claim 8 wherein said processor means subjects said pre-set number of digital signal values to a fast Fourier transform procedure to derive a spectral analysis thereof.

10. The digital system as recited in claim 8, wherein said decimating enables said second signal train to be sampled at a rate of Fs, where:

$$Fs = (samples \times fundamental\ frequency)/n$$

where:
    "Fs" is the sample rate;
    "fundamental frequency" is either 50 Hz or 60 Hz;
    "samples" is a number of digital values to be subjected to analysis; and
    "n" is an integer number of cycles or half cycles of the fundamental to be subjected to analysis.

11. The digital system as recited in claim 10, wherein said synch pulses are generated at a frequency which enables said filter means to derive said sample rate Fs by decimation, using either an integer value or an integer value plus 0.5.

12. A method for measuring cyclic disturbance signals induced on an electrical line by a connected unit under test (UUT), said method comprising the steps of:
    a. receiving and converting a first train of digital signals to a cyclic analog test signal, in synchronism with a synchronizing pulses, and applying said cyclic analog test signal to said electrical line;
    b. receiving and converting an analog cyclic disturbance signal on said electrical line to a second train of digital signals, in synchronism with said synchronizing pulses, such that said second train of digital signals is produced in frequency synchronism with said cyclic analog test signal that is applied to said electrical line; and c. signal analyzing a portion of said second train of digital signals, said portion representative of at least an integer number of half cycles of said analog cyclic disturbance signal.

13. The method as recited in claim 12, wherein said processor means subjects said portion representative of at least an integer number of half cycles of said analog cyclic disturbance signal to an amplitude modulation analysis procedure.

14. The method as recited in claim 12, step (a) causes a synthesized AC signal, having either a 50 or 60 Hertz frequency, to be applied to said electrical line, said frequency controlled by said first train of digital signals.

15. The method as recited in claim 12, wherein said portion is representative of an integer number of full cycles of said analog cyclic disturbance signal.

16. The method as recited in claim 15, wherein said signal analyzing step (c) decimates said second signal train to derive a pre-set number of digital signal values which exactly encompass an integer number of cycles of said analog cyclic response signal.

17. The method as recited in claim 16, wherein said signal analyzing step (c) subjects said pre-set number of digital signal values to a fast Fourier transform procedure to derive a spectral analysis thereof.

18. The method system as recited in claim 16, wherein said decimating enables said second signal train to be sampled at a rate of Fs, where:

$$Fs = (samples \times fundamental\ frequency)/n$$

where:

"Fs" is the sample rate;

"fundamental frequency" is either 50 Hz or 60 Hz;

"samples" is a number of digital values to be subjected to analysis; and

"n" is an integer number of cycles or half cycles of the fundamental to be subjected to analysis.

19. The digital system as recited in claim 18, wherein said synch pulses occur at a frequency which enables said filter means to derive said sample rate Fs by decimation, using either an integer value or an integer value plus 0.5.

20. A digital system for measuring cyclic disturbance signals induced on an electrical line by a connected unit under test (JUT), said digital system comprising:

digital to analog (D/A) conversion means for receiving and converting a first train of digital signals to a cyclic analog test signal and for applying said cyclic analog test signal to said electrical line, said D/A conversion means having a synchronizing input which, in response to a synch pulse input, operates to convert a digital input to an analog signal level;

detector means for detecting an analog cyclic disturbance signal by sensing current flow through an impedance positioned in said electrical line and between said D/A conversion means and a connected UUT;

analog to digital (A/D) conversion means for receiving said analog cyclic disturbance signal from said detector means and converting said analog disturbance signal to a second train of digital signals, said A/D conversion means having a synchronizing input which, in response to a synch pulse input, operates to convert an analog cyclic disturbance signal level to a digital signal;

synch generator means for generating a train of synch pulses and concurrently applying said synch pulses to said synchronizing input of each of said D/A conversion means and said A/D conversion means; and processor means coupled to said D/A conversion means and said A/D conversion means, for outputting said first train of digital signals to said D/A conversion means and for receiving said second train of digital signals from said A/D conversion means, and for subjecting a portion of said second train of digital signals to signal analysis, said portion representative of at least an integer number of half cycles of said analog cyclic disturbance signal.

* * * * *